United States Patent [19]

Hosaka et al.

[11] 4,455,485
[45] Jun. 19, 1984

[54] LASER BEAM SCANNING SYSTEM

[75] Inventors: Sumio Hosaka, Hachioji; Tatsuo Harada, Fuchu; Akihiro Takanashi, Kokubunji, all of Japan

[73] Assignee: Hitachi, Ltd., Tokyo, Japan

[21] Appl. No.: 324,791

[22] Filed: Nov. 25, 1981

[30] Foreign Application Priority Data

Nov. 26, 1980 [JP] Japan ............................ 55-168357[U]

[51] Int. Cl.³ .............................................. H01J 3/14
[52] U.S. Cl. ..................................... 250/234; 350/358
[58] Field of Search ................ 350/358, 371, 6.1–6.91; 250/201, 234, 235, 236, 216

[56] References Cited

U.S. PATENT DOCUMENTS

| | | | |
|---|---|---|---|
| 3,514,534 | 5/1970 | Korpel | 350/358 |
| 3,531,184 | 9/1970 | Adler | 350/358 |
| 4,390,875 | 6/1983 | McNaney | 350/358 |

Primary Examiner—David C. Nelms
Attorney, Agent, or Firm—Antonelli, Terry & Wands

[57] ABSTRACT

A laser beam scanning system for focusing a laser beam to a fine spot and for scanning precisely a large field includes an acousto-optical deflector enabled to deflect a laser beam in the direction of one axis or in the directions of two axes, while maintaining the fine spot diameter, to scan a small field, a relay lens for projecting said deflection point to the center of an objective lens, to effect the focusing of the beam to a fine spot, a high speed carriage enabled to move with high accuracy in biaxial directions, a precise position detector enabled to detect the position of the carriage, and a controller for organically controlling the aforementioned respective functions thereby to make it possible to precisely deflect the laser beam over a large field, whereby a scanning operation of a large field at a high speed and with a high accuracy is performed by the laser beam.

5 Claims, 1 Drawing Figure

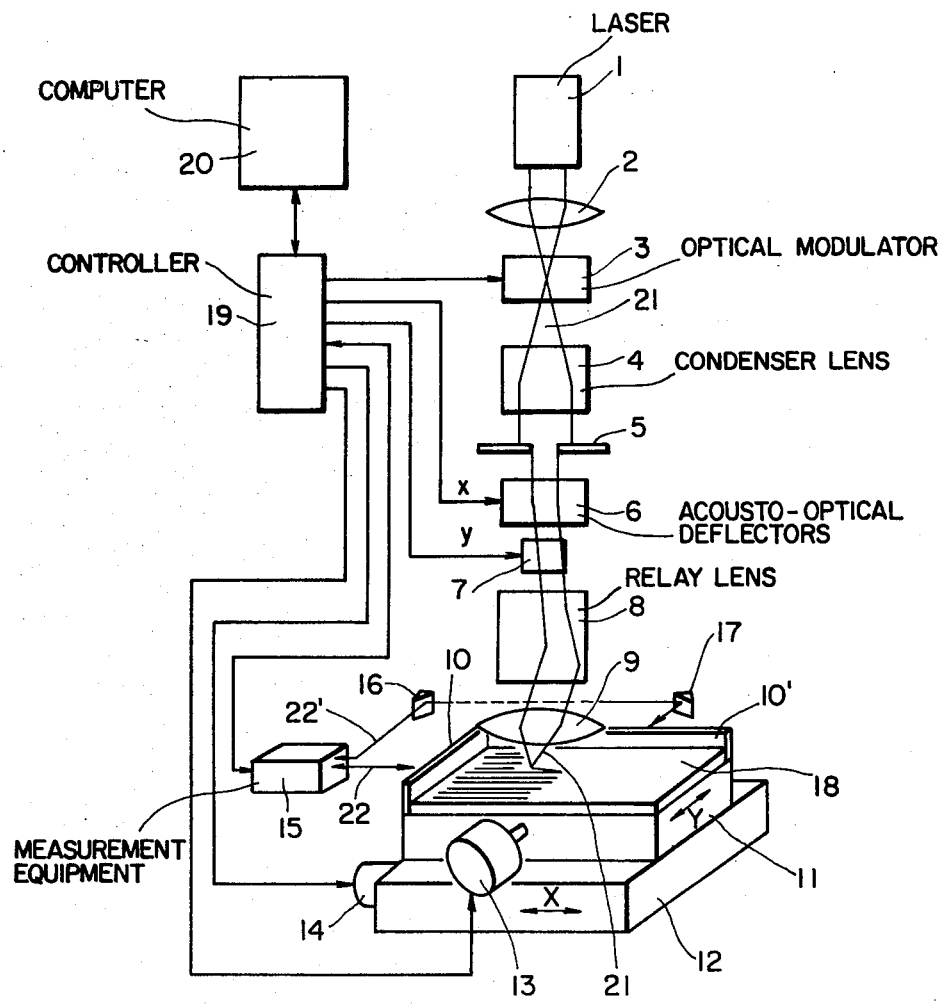

LASER BEAM SCANNING SYSTEM

BACKGROUND OF THE INVENTION

1. Field of the Invention

The present invention relates to improvements in a laser beam scanning system and, more particularly, to a laser beam scanning system which is so improved that it can scan a large area at a high speed and with high accuracy using a finely focused laser beam.

2. Description of the Prior Art

Some of the laser beam scanning systems according to the prior art make use of a polygon mirror or resort to the reciprocating mechanical motions of an objective lens. In the former scanning system using the polygon mirror, a biaxial scanning operation is performed by effecting both one scanning operation over a large field in a wide angle range in one direction with a lens having a large F-$\theta$ value and another scanning operation at a right angle in a manner to drive a specimen to be scanned in a continuous mode or in a step-and-repeat mode with the use of a carriage. In this case, the scanning speed is high, but the diameter of the focused laser beam spot is so large as to raise problems relating to the scanning accuracy and the resolution. In the latter scanning system, on the other hand, the scanning operation over a large field is performed by effecting reciprocating mechanical motions of the objective lens in a plane in parallel with the specimen surface. In this case, since the system can use an objective lens having a high numerical aperture (N.A.), the laser probe diameter is so small as to provide an excellent resolution, but the there arises problems in the scanning speed and accuracy because of the mechanical motions.

SUMMARY OF THE INVENTION

The present invention has been conceived to solve all the problems concomitant with the prior art system thus far described and has an object to provide a laser beam scanning system which is so improved that it can scan a wide area at a high speed and with a high accuracy using a finely focused laser beam.

In order to achieve the aforementioned object, in accordance with the present invention, an acousto-optical deflector is used as the deflector of the laser beam, by which a small field is scanned at a high speed in at least one direction with the finely focused laser beam, and there is interposed between said deflector and the objective lens a relay lens, by which a deflection point is projected toward the center of the objective lens, while having its diameter after the deflection enlarged by the aforementioned relay lens, thereby to make it possible to make the diameter of the beam spot sufficiently small after it has been focused by the objective lens. Moreover, since the deflection field by the aforementioned optical deflection system cannot be made so large, a laser beam scanning operation at a high speed and with a high accuracy over a large field is made possible in accordance with the present invention by combining that optical deflection system with a specimen carriage which is enabled to move at a high speed and with a high accuracy in biaxial directions. The other objects and features of the present invention as well as the operational effects obtainable therefrom will become sequentially apparent in the following detailed description made in conjunction with the embodiments thereof.

BRIEF DESCRIPTION OF THE DRAWING

The FIGURE is a schematic diagram showing the general construction of a laser beam scanning system according to one embodiment of the present invention.

DESCRIPTION OF THE PREFERRED EMBODIMENTS

Before entering into the detailed description of the present invention, the basic concept of the present invention will first be briefly described.

Specifically, the present invention is featured mainly by the fact that the following three points are organically combined and used so as to make it possible to scan a large field at a high speed and with a high accuracy using a laser beam focused to have a fine spot diameter.

Firstly, an acousto-optical deflecting element is used in accordance with the present invention in place of the deflection system which resorts to the polygon mirror or the reciprocating motion mechanism used in the prior art. Generally speaking, in case the laser beam after it has been deflected by the deflector is condensed for use by the objective lens, the spot diameter $D_g$ of the laser beam after it has been focused by the objective lens is expressed by the following Equation (1), if the intensity of said laser beam is a Gaussian distribution:

$$D_g = \frac{2\lambda \cdot f}{\pi \omega_o} \tag{1}$$

In the Equation (1): $\lambda$ stands for the wavelength of the laser beam; f stands for the focal length of the objective lens; and $\omega_o$ stands for the beam diameter when the laser beam incides upon the objective lens.

On the other hand, the deflection $L_d$ for a deflection angle $\theta$ is expressed by the following Equation (2):

$$L_d = f \cdot \tan \theta \tag{2}$$

In order to focus the spot diameter $D_g$ of the laser beam to a fine diameter around a laser wavelength dimension and to enlarge the deflection $L_d$, it is seem to be necessary from the Equations (1) and (2) that the beam diameter, $\omega_o$ incident upon the objective lens be enlarged and the focal length of said objective lens be enlarged in accordance with the Equation (2). It is, however, difficult to realize an objective lens which can satisfy such specifications, thus raising a limit of itself. In order to maintain the spot diameter $D_g$ of the laser beam at a fine diameter about the laser wavelength, more specifically, it is seem to be necessary from the Equation (1) that the focal length f be made small, and consequently the deflection $L_d$ of the Equation (2) has to be set at a short value. From this point, therefore, it is advantageous that an acousto-optical deflecting element having a far higher deflection frequency and controllability that the polygon mirror be used as the deflector.

Secondly, in order to focus the spot diameter $D_g$ to a fine diameter around the laser wavelength dimension, as is expressed by the equation (2), it is necessary that the diameter $\omega_o$ of the laser beam incident upon the objective lens be set at a large value to fully use the available diameter of the objective lens. Accordance with the present invention, therefore, there is interposed between the aforementioned acousto-optical deflector and objective lens a relay lens which is enabled to project the deflection point of the laser beam by the aforementioned deflector toward the center of the aforementioned objective lens and to enlarge the diameter of the laser beam.

Thirdly, since the deflection by the acousto-optical deflecting element covers a small field, as has been described hereinbefore, a sample carriage which can carry a specimen to be scanned at a high speed and with a high accuracy in biaxial directions is used in combination in the present invention so as to make possible the deflection over a large field. Incidentally, since the three technical means thus far described are respectively well known in the art, their detailed explanations are omitted here.

The present invention will now be described in more detail in connection with one embodiment thereof with reference to the accompanying drawing. The FIGURE shows the general construction in the case where the laser beam scanning system of the present invention is applied to a pattern generator. A laser beam 21, which is generated from a laser source 1 for the latent image forming or laser machining purpose, is focused upon the center of an optical modulator 3 by the action of a condensing lens 2. After the modulation, the laser beam 21 is again collimated by a condenser lens 4 to a collimated beam, which is deflected in the directions of two axes X and Y through an aperture 5 by the actions of X- and Y-axes acousto-optical deflectors 6 and 7. These acousto-optical deflectors are made of $TeO_2$, $NiNbO_3$, $PbMoO_4$ or the like. The laser beam having passed through the deflectors 6 and 7 has its optical path so bent by a relay lens 8 as to have the deflection point projected toward the center of an objective lens 9 and has its beam diameter magnified by the relay lens 8 until it is focused as a fine beam spot upon the upper surface of a speciman 18 by the objective lens 9. The beam spot thus made to have the fine diameter is deflected to scan the fine field of the specimen surface at a high speed and in the high accuracy. The drawing shows the behavior of the case in which the raster scanning operaton is performed by continuously driving the specimen carriage. More specifically, the laser beam is finely deflected in the X-axis direction so that such a band-shaped field on the specimen surface as is narrowed in the X-axis direction is deflected and scanned by the aforementioned beam spot by the fact that the specimen carriage is continuously driven in the Y-axis direction by a Y-axis driving motor 13. Said band-shaped field is sequentially moved by driving the specimen at intervals in the X-axis direction by the action of an X-axis driving motor 14 so that the wide area on the specimen surface is completely scanned with the laser beam 21.

At this time, a laser measurement equipment 15 irradiates measuring mirrors 10 and 10', which are carried on a Y-axis moving table 11, with laser beams 22 and 22' for measuring the positions to precisely measure the position of the carriage while the specimen is being moved thereby to feed an error from a destination address to a controller 19 so that said error is compensated by compensating the input signals to the acousto-optical deflectors 6 and 7 thereby to perform the deflected scanning operations at a high speed and with a high accuracy. On the other hand, desired pattern data is stored in the memory of a computer 20 so that, on the basis of those pattern data, the optical modulator 3 is operated by the controller 19 in a manner to correspond to the deflected position of the laser beam spot whereby a desired resist latent image, electrostatic latent image, machined pattern or the like is formed on the specimen surface. Incidentally, in the drawing, numeral 12 indicates an X-axis moving table, and numerals 16 and 17 indicate deflectors for the measuring laser beam.

The embodiment thus far described is directed to the case in which the present invention is applied to pattern generator. It goes without saying that the present invention can be applied so a similar system, such as a mask inspection system or a mask correction system. Moreover, an example embodying the scanning system in the embodiment thus far described is directed to the case in which the raster scanning system resorting to the continuous drive of the carriage in the direction of the axis Y is adopted. It is natural that the present invention can be applied even to the case in which the raster scanning and random access scanning systems using the step and repeat drive of the carriage are adopted.

As has been described hereinbefore, the present invention can facilitate the application of the laser beam to the semiconductor lithographic technology which requires high speed and accuracy in the deflection. Moreover, the present invention can provide various advantages including one that the deflecting speed is improved to about one order shorter than that of the prior art so that the time period required for the pattern formation can be shortened while maintaining the high accuracy.

What is claimed is:

1. A laser beam scanning system for scanning the surface of a specimen with a laser beam having a fine spot diamter, comprising: means for producing a finely-focused laser beam, an acousto-optical deflector for deflecting said laser beam at a high speed with a small field at a deflecting point; an objective lens for focusing the laser beam from said acousto-optical deflector to a spot having a fine diameter upon the surface of the specimen; a relay lens interposed between said acousto-optical deflector and said objective lens for projecting the laser beam deflecting point toward the center of said objective lens; and specimen positioning means including a specimen carriage for moving said specimen in the directions of two orthogonal axes in a parallel plane to said specimen surface.

2. A laser beam scanning system as set forth in claim 1, wherein said acousto-optical deflector includes means for deflecting the incident laser beam in the direction of one of said two orthogonal axes.

3. A laser beam scanning system as set forth in claim 1, wherein said acousto-optical deflector includes means for deflecting the incident laser beam in the directions of said two orthogonal axes.

4. A laser beam scanning system as set forth in claim 1, wherein said laser beam producing means includes an optical modulator for modulating the laser beam which incides upon said acousto-optical deflector.

5. A laser beam scanning system as set forth in claim 1, wherein said specimen positioning means includes a position deflector for detecting the position of said specimen carriage; and means for correcting the input signal to said acousto-optical deflector in response to the output signal of said position detector.

* * * * *